United States Patent [19]

Stokes et al.

[11] Patent Number: 5,179,309
[45] Date of Patent: Jan. 12, 1993

[54] SURFACE ACOUSTIC WAVE CHIRP FILTER

[75] Inventors: Robert B. Stokes, Torrance; Kuo-Hsiung Yen, Manhattan Beach; Jeffrey H. Elliott, Santa Monica, all of Calif.

[73] Assignee: TRW Inc., Redondo Beach, Calif.

[21] Appl. No.: 152,203

[22] Filed: Feb. 4, 1988

[51] Int. Cl.$^5$ .......................................... H01L 41/04
[52] U.S. Cl. ............................. 310/313 B; 310/313 R; 333/153; 333/154
[58] Field of Search ........... 310/313 R, 313 B, 313 C, 310/313 D; 333/150–155, 193–196

[56] References Cited

U.S. PATENT DOCUMENTS 3,919,669 11/1975 Hartemann ................. 310/313 B X
4,477,784 10/1984 Maerfeld et al. ................... 333/153
4,499,393  2/1985 Stokes et al. ............. 310/313 R X
4,633,117 12/1986 Bloch et al. ..................... 310/313 B
4,635,008  1/1987 Solie ............................... 333/154 X
4,707,631 11/1987 Stokes et al. ............... 310/313 B X
4,746,882  5/1988 Solie ........................... 310/313 B X
4,749,971  6/1988 Solie ............................... 333/154 X Primary Examiner—David Cain
Attorney, Agent, or Firm—Noel F. Heal; Ronald L. Taylor

[57] ABSTRACT

A surface acoustic wave (SAW) chirp signal processor having a piezoelectric substrate, an array of input transducers and an array of output transducers. In its chirp compression mode, the device has chirp signals applied in parallel to its input transducers and produces compressed output pulses at its output transducers, corresponding to selected chirp rates. The input transducers are successively offset with respect to a focal point on the array of output transducers, by distances that successively and linearly increase or decrease from transducer to transducer, consistent with the increase or decrease in the wavelength of the chirp signals. The device may also be used in a pulse expansion mode, by inputting a broadband pulse into a selected one of the output transducers. The input transducers then produce a chirp signal having a rate corresponding the selected to output transducer.

6 Claims, 1 Drawing Sheet

SURFACE ACOUSTIC WAVE CHIRP FILTER

CROSS-REFERENCES TO RELATED APPLICATIONS

This application is related to the following applications, all of which are assigned to the same assignee as the present application:

(1) Surface Acoustic Wave Spectrum Analyzer, Ser. No. 580,575, filed Feb. 15, 1984, Yen et al., now issued as U.S. Pat. No. 4,499,393;

(2) Signal- Processing System and Method, Ser. No. 529,066, filed Sep. 2, 1983, Brooks, now issued as U.S. Pat. No. 4,541,687;

(3) SAW Channelizer Filters, Robert Stokes et al., filed concurrently with this application.

BACKGROUND OF THE INVENTION

This invention relates generally to surface acoustic wave (SAW) devices and, more particularly, to SAW devices used in the analysis of linear-frequency-modulated (LFM) or chirp signals.

SAW devices employ substrates of a piezoelectric material, across which elastic surface waves are propagated between sets of electro-acoustic transducers disposed on the substrate surface. The surface waves, called Rayleigh waves, have an amplitude of displacement that is largest right at the substrate surface. In a piezoelectric material, deformations induced by the waves induce local electric fields, which are propagated with the acoustic waves and extend into space above the surface of the material. These electric fields will interact with electrodes disposed on the surface of the material, to serve as electrical input and output transducers for the surface acoustic wave device.

There is a need in some applications to detect signals that have been subject to unknown linear frequency modulation (LFM), sometimes referred to as chirp signals. It is important in these applications to be able to determine the chirp rate, that is the time rate of frequency change, df/dt, usually measured in megahertz per microsecond. Prior approaches to this problem include the use of SAW reflective array compressors (RACs). The detection of each particular chirp rate requires the use of a separate RAC. Since most applications involve the detection of multiple chirp rates, multiple RACs are needed, and this arrangement is relatively bulky and expensive.

Accordingly, there is a need for a simpler form of SAW device to perform the same function. As will become apparent from the following summary, the present invention satisfies this need.

SUMMARY OF THE INVENTION

The present invention resides in a chirp signal processor employing diffraction principles, rather than those of conventional in-line SAW devices. Briefly, and in general terms, the invention comprises a SAW diffraction device having a piezoelectric substrate, an array of point-source input transducers, all connected electrically in parallel, and an array of output transducers, each of which is sensitive to the input of a selected chirp rate at the input transducers. The most important aspect of the invention is the manner in which the input transducers are positioned on the substrate. They are spaced from a focal point by linearly increasing or decreasing amounts with respect to successive transducers, consistent with the linearly increasing or decreasing frequency of a chirp signal. The output transducers are arrayed along a focal arc through the focal point, and each is sensitive to a different chirp rates. That is to say, each output transducer produces a strong output pulse only in response to the input of a specific chirp rate at the input transducers.

The same structure may be employed in an inverse manner to generate a chirp signal from an input pulse. A broadband pulse of short duration is applied to a selected one of the "output" transducers, and this results in the generation of a chirp signal at the "input" transducers, corresponding to the chirp rate detectable by the selected output transducer. In effect, the device operates as a set of pulse expanders in this mode, but is smaller and simpler than an equivalent set of pulse expanders of the prior art.

It will be appreciated from the foregoing that a SAW chirp processor may be constructed in accordance with the invention as a single SAW device, in contrast to the multiple SAW devices required in chirp processors of the prior art. Other aspects and advantages of the invention will become apparent from the following more detailed description, taken in conjunction with the accompanying drawings.

DESCRIPTION OF THE PREFERRED EMBODIMENT

Figure 1:
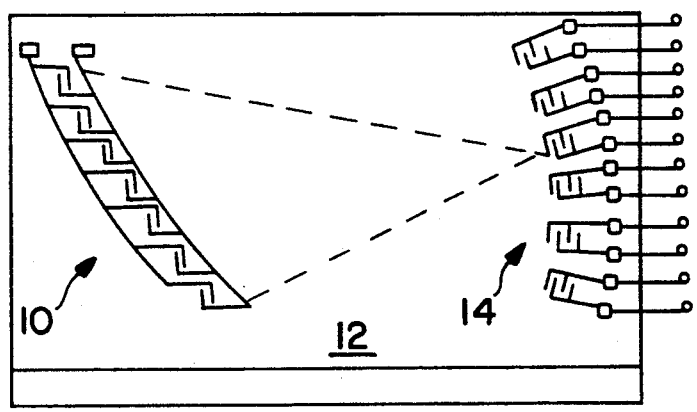
FIG. 1 is a diagrammatic view of a SAW diffraction-effect device employed for spectrum analysis.

As shown in the drawings for purposes of illustration, the present invention is concerned with the processing or detection of chirp signals, that is signals of which the frequency varies linearly in time from an initial value to a final value. This is sometimes referred to as linear frequency modulation (LFM). Prior techniques for the determination of chirp rate, the linear rate of frequency change (df/dt), have relied on multiple surface acoustic wave (SAW) devices, since a separate device was required for the detection of each chirp rate.

In accordance with the present invention, multiple chirp signals are detected in a single SAW device employing diffraction principles. Diffraction-effect SAW devices have been described in the cross-referenced applications for use as spectrum analyzers or channelizers. Although the crossreferenced applications are not necessarily prior art with respect to the present invention, it is important to understand the principles and limitations of the devices they disclose.

Although most SAW devices are of the "in-line" type, devices employing a single propagation direction, SAW technology can also be applied to diffraction-effect devices, such as spectrum analyzers, as shown in FIG. 1. SAW spectrum analyzers operate on a principle closely analogous to that of an optical diffraction grating, in which a beam of light is dispersed into separate beams of relatively small bandwidth. Basically, the channelizer device includes a curved array of input transducers, indicated by reference numeral 10, located on a piezoelectric substrate 12. The input transducers 10 are effectively point sources of acoustic radiation, which can be considered to radiate circular wavefronts if the anisotropic nature of most SAW substrate materials is neglected. Wavefronts from the input transducers 10 reach a zero-order focal point at the same time and reinforce each other. The zero-order focal point is, therefore, at the center of curvature of the input transducer array. At a first-order focal point, displaced from the zero-order focal point, wavefronts from two adjacent transducers still arrive in phase with each other, but their path lengths differ by one complete wavelength. For higher orders of diffraction, the path lengths differ by integral multiples of a wavelength. If the frequency of the signal applied to the input array is changed, the firstorder focal point is shifted laterally with respect to the zero-order focal point. If a wideband input signal is applied to the input array, the focal point becomes a focal arc, each point on the arc representing a different input frequency. An array of output transducers 14 is disposed on the focal arc, and each is responsive to a narrow band of frequencies.

If adjacent input transducers are offset in distance from the focus by a one center-frequency wavelength spacing, the device is said to operate in the first diffraction order. Operation in the second diffraction order is obtained by offsetting adjacent input transducers by two wavelengths, and so forth.

Figure 2:
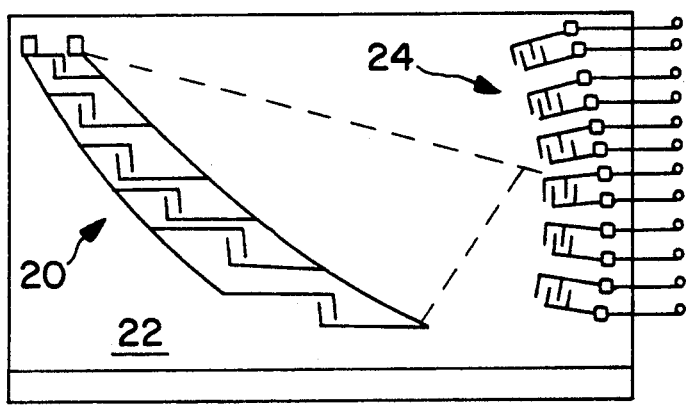
FIG. 2 is a diagrammatic view of a SAW diffraction-effect device employed in accordance with the invention for chirp signal processing.

FIG. 2 shows how this structure may be modified to perform a chirp processing function. The input transducers, referred to by reference numeral 20 are disposed on a substrate 22 and there is a corresponding array of output transducers 24. However, the spatial relationship of the input transducers 20 is selected to provide the chirp processing function. More specifically, the input transducers are successively offset by linearly increasing or decreasing amounts with respect to a primary focal point.

Figure 3A:
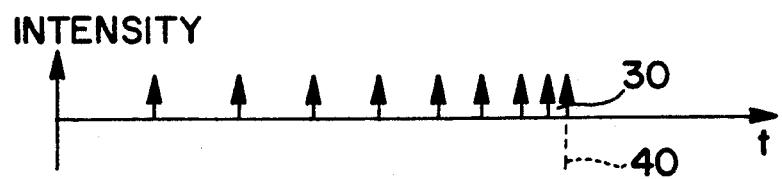
FIGS. 3a-3c are timing diagrams showing the result of an impulse at the input array, indicating the arrival times of wave crests at three successive output transducers of the device shown in FIG. 2, and showing chirped impulse responses for three different chirp rates.
Figure 3B:
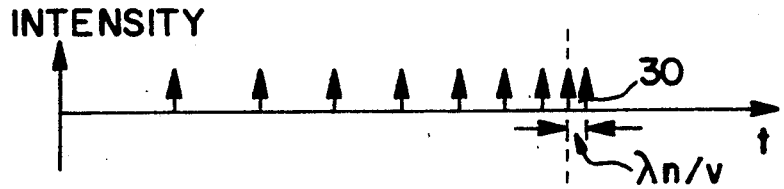
Figure 3C:
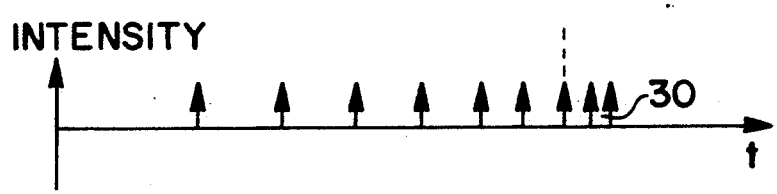

Operation of the device may be best understood by considering FIGS. 3a-3c. FIG. 3a represents the arrival times, at a primary focal point, of successive wavefronts from a first input transducer shown at the top of the input array 20. The wavefronts are more widely spaced initially and become linearly more closely spaced as time advances, indicating a chirp signal in which the frequency is linearly increasing. In accordance with the example, the path length from the second transducer from the top of the input array 20 is closer to the primary focal point than the first transducer by an amount equal to the distance between the last two wavefronts of the chirp signal, indicated at 30. Therefore, the arrival times for wavefronts from the second transducer will be spaced as shown in FIG. 3b, and it will be observed that the last wavefront from the first transducer arrives at the same time as the second-to-last wavefront from the second transducer. The third transducer in the input array is offset by an amount equal to the distance between the second- and third-to-last wavefronts in the chirp signal. Therefore, the times of wavefront arrival from the third transducer are as shown in FIG. 3c.

It will be observed that there is time coincidence between the last wavefront from the first transducer, the second-to-last wavefront from the second transducer, and the third-to-last wavefront from the third transducer. This progression continues for the other transducers in the input array, each contributing a wavefront that corresponds in time with those already indicated for the first three transducers. The result is that an output transducer positioned at the primary focal point will produce a distinct and relatively short pulse at a time corresponding to the time 40 in FIGS. 3a-3c. For different chirp rates from the one designed into the input transducer spacings, such an output transducer will produce a smaller output or none at all. However, different chirp rates will produce pulses at positions along the focal arc on which the output transducers are arrayed. Therefore, each output transducer will detect a different chirp rate, and the device is capable of processing chirp signals introduced at its input, to produce output pulses indicative of the detection of the various chirp rates.

The structure of the invention is also capable of operation in a pulse expansion mode, in which a selected chirp rate is generated from a broadband pulse signal. The pulse is applied to a selected output transducer, corresponding to the desired chirp rate, and the chirp signal is generated at the "input" transducers.

It will be appreciated from the foregoing that the present invention represents a significant advance in the field of SAW chirp processors. In particular, the invention provides a technique for detection and identification of chirp signals based on unique chirp rates. It will also be appreciated that, although a specific embodiment of the invention has been disclosed in detail for purposes of illustration, various modifications may be made without departing from the spirit and scope of the invention. Accordingly, the invention is not to be limited except as by the appended claims.

We claim:

1. A method of analyzing chirp signals in a surface acoustic wave (SAW) device having a piezoelectric substrate, and array of broadband, pointsouce, parallel input transducers and an array of output transducers, the method comprising the steps of:

spacing the input transducers with respect to a first output transducer located at a primary focal point such that the differential distances of the transducers from the primary focal point changes linearly from transducer to adjacent transducer, at a rate corresponding to a first selected linear chirp rate;

positioning a second output transducer on an arc through the primary focal point, such that the differential distances of the input transducers with respect to the second output transducer change linearly, from input transducer to input transducer, at a rate corresponding to a second selected chirp rate;

positioning additional output transducers on the same arc through the primary focal point, such that the differential distances of the input transducers to respective additional output transducers change linearly, from input transducer to input transducer, at rates corresponding to additional selected chirp rates;

applying to the input transducers an input signal including as a component at least one chirp signal; and obtaining a pulse output signal from one of the output transducers, in response to a particular chirp input signal within a narrow range of chirp rates.

2. A method as defined in claim 1, wherein:
the input signal includes multiple chirp signals of different chirp rates; and the method further includes obtaining pulses from multiple output transducers, each transducer producing an output corresponding to a different narrow range of chirp rates.

3. A method of synthesizing chirp signals in a surface acoustic wave (SAW) device having a piezoelectric substrate, and array of broadband, point-source, parallel input transducers and an array of output transducers, the method comprising the steps of:

spacing the input transducers with respect to a first output transducer located at a primary focal point such that the differential distances of the transducers from the primary focal point changes linearly from transducer to adjacent transducer, at a rate corresponding to a first selected linear chirp rate;

positioning a second output transducer on an arc through the primary focal point, such that the differential distances of the input transducers with respect to the second output transducer change linearly, from input transducer to input transducer, at a rate corresponding to a second selected chirp rate;

positioning additional output transducers on the same arc through the primary focal point, such that the differential distances of the input transducers to respective additional output transducers change linearly, from input transducer to input transducer, at rates corresponding to additional selected chirp rates;

applying a pulse signal to at least one of the output transducers; and obtaining from the input transducers at least one chirp signal at a desired chirp rate corresponding to the selected of output transducers for application of the pulse signal.

4. A method as defined in claim 3, wherein:

the applying step applied pulse signals to multiple output transducers; and the obtaining step produces multiple chirp signals at the input transducers.

5. A surface acoustic wave (SAW) chirp signal processor, comprising:

a piezoelectric substrate;

an array of broadband, point-source input transducers connected in parallel, disposed on the substrate and connected to receive a chirp input signal having an unknown linear chirp rate;

a first output transducer disposed on the substrate at a primary focal point to receive acoustic signals from the point-source input transducers, wherein the input transducers are positioned such that he differential distances of the input transducers with respect to the primary focal point increase linearly, from input transducer to input transducer, at a rate corresponding to a first selected linear chirp rate, and wherein the first output transducer produces an output pulse only when the unknown linear chirp rate is approximately equal to the selected chirp rate;

a second output transducer, disposed on the substrate at a point displaced from the first output transducer, such that the differential distances of the input transducers with respect to the second output transducer increase linearly, from input transducer to input transducer, at a rate corresponding to a second selected linear chirp rate, and wherein the second output transducer produces an output pulse only when the unknown linear chirp rate is approximately equal to the second selected chirp rate; and additional output transducers, disposed on the substrate at points further displaced from the first output transducer, such that the differential distances of the input transducers from respective additional output transducers increase linearly, from input transducer to input transducer, at rates corresponding to additional selected chirp rates, and wherein each of the output transducers produces an output pulse only in response to in input chirp signal within a specific narrow range of chirp rates.

6. A SAW chirp signal processor as set forth in claim 5, in which:

the processor is used as a pulse expander, whereby a wideband pulse is applied to one of the output transducers, and a chirp signal of the corresponding chirp rate will appear at the input transducers.

* * * * *